United States Patent [19]

Schwent et al.

[11] Patent Number: 5,251,331
[45] Date of Patent: Oct. 5, 1993

[54] HIGH EFFICIENCY DUAL MODE POWER AMPLIFIER APPARATUS

[75] Inventors: Dale G. Schwent, Hoffman Estates; Rashid M. Osmani, Carol Stream; Gary M. Cristiano, Hoffman Estates, all of Ill.

[73] Assignee: Motorola, Inc., Schaumburg, Ill.

[21] Appl. No.: 850,615

[22] Filed: Mar. 13, 1992

[51] Int. Cl.$^5$ .......................... H04B 1/04; H04B 1/40; H03F 3/04
[52] U.S. Cl. ..................................... 455/127; 455/74; 455/93; 375/5; 330/297
[58] Field of Search ............... 455/126, 127, 343, 116, 455/74, 93, 89; 375/5; 330/297

[56] References Cited

U.S. PATENT DOCUMENTS

| | | | |
|---|---|---|---|
| 4,870,698 | 9/1989 | Katsuyama et al. | 455/127 |
| 4,994,757 | 2/1991 | Bickley et al. | 455/126 |
| 5,060,294 | 10/1991 | Schwent | 455/93 |
| 5,126,688 | 6/1992 | Nakanishi et al. | 455/126 |
| 5,168,516 | 12/1992 | Ito | 455/93 |
| 5,175,871 | 12/1992 | Kunkel | 455/127 |

Primary Examiner—Reinhard J. Eisenzopf
Assistant Examiner—Lisa Charouel
Attorney, Agent, or Firm—Kenneth W. Bolvin

[57] ABSTRACT

The dual mode power amplifier apparatus of the present invention is comprised of a number of power amplifiers (101-103) coupled to a voltage convertor (104) through their collector supply lines. A mode select line (105) is connected to the voltage convertor (104) to select a digital or analog mode. The preferred embodiment of the present invention is used in a hybrid digital/analog radiotelephone. In the digital mode, the voltage convertor (104) is turned off and the voltage convertor (104) supply voltage is allowed through to the collectors of the power amplifiers (101-103). This permits the power amplifiers (101-103) to operate with optimum linearity in a digital transmission environment. In an analog environment, the voltage convertor (104) is on and supplying a reduced voltage to the power amplifiers (101-103) allowing more efficient operation in this mode.

5 Claims, 3 Drawing Sheets

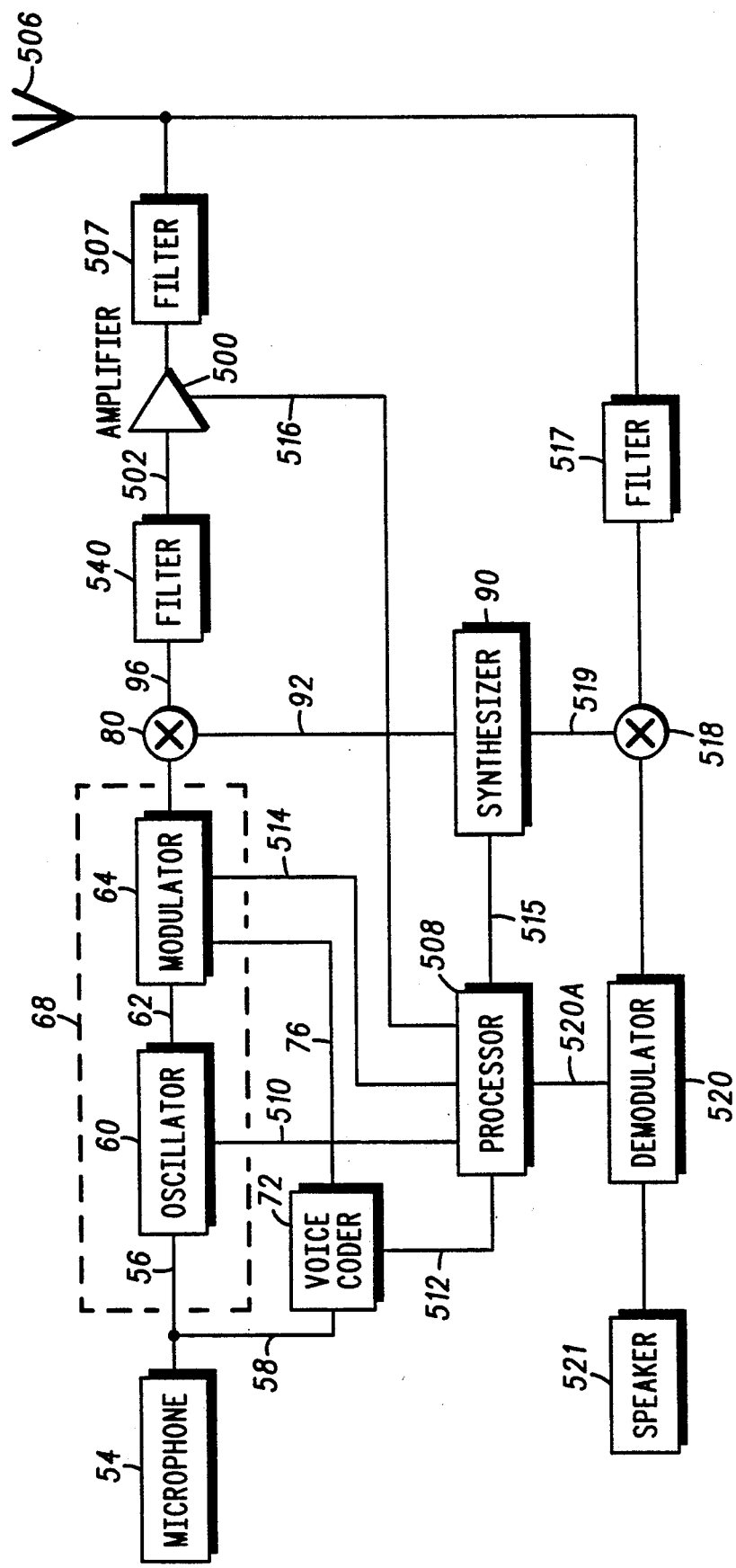

HIGH EFFICIENCY DUAL MODE POWER AMPLIFIER APPARATUS

FIELD OF THE INVENTION

The present invention relates generally to the field of amplifiers and particularly to dual mode power amplifiers.

BACKGROUND OF THE INVENTION

The rapid expansion of the number of cellular radiotelephones coupled with the desire to provide additional services has prompted the use of an improved transmission technique, time division multiple access (TDMA). TDMA increases system capacity over the current analog system through the use of digital modulation and speech coding techniques. A TDMA transmission is comprised of many time slots.

A linear modulation technique, $\pi/4$ differential quadrature phase shift keying ($\pi/4$ DQPSK), is used to transmit the digital information over the channel. The use of linear modulation in the U.S. Digital Cellular system provides spectral efficiency allowing the use of 48.6 kbps channel data rates. $\pi/4$ DQPSK transmits the data information by encoding consecutive pairs of bits, commonly known as symbols, into one of four phase angles ($\pm\pi/4$, $\pm3\pi/4$) based upon gray encoding. These angles are then differentially encoded to produce an 8 point constellation.

Transmitters designed for use in the U.S. Digital Cellular system are required to operate in both the analog and digital modes. The digital mode uses the $\pi/4$ shift DQPSK modulation, and can be implemented using a linear transmitter. The analog mode uses conventional frequency modulation and allows the use of higher efficiency non-linear transmitters.

Conventional linear amplifiers are inherently less efficient than their constant envelope counterparts due to the types of signals they must amplify. A constant envelope amplifier is required to put out a signal at only one power level over time. It can therefore be optimized for peak efficiency at that power level. This optimization entails placing a load impedance on the device such that, at the designed power out, the AC collector voltage magnitude is close to or even exceeds the DC supply voltage. In this condition, the amplifier is close to or actually in saturation and has optimum efficiency.

The linear amplifier must amplify signals at power levels that vary over time, with whatever amplitude modulation that has been impressed upon the input signal. No saturation is allowed in the linear amplifier, or there will be severe distortion of the envelope. This distortion causes loss of amplitude information and spreading of the transmit spectrum into adjacent channels. The amplifier circuit must operate such that at peak power out, the amplifier is not in saturation. While it is possible to optimize for good efficiency at peak power out, the efficiency falls off rapidly as power out falls.

This creates a problem for the U.S. Digital Cellular radio which is intended to operate in both linear and constant envelope modes. When compared to current analog radios with constant envelope amplifiers, efficiency will be much lower in the digital radio. In the linear mode, efficiency is optimized for peak power out, but the signal spends only a short time there. Average efficiency will be lower than peak power efficiency because of this. For digital cellular this is not a severe limitation since a TDMA system is used and the transmitter is only on ⅓ of the time (only every third time slot is used by the radio). Even if the average efficiency is poor in this mode, transmit current is not significantly worse (and may be better) than a conventional analog radio.

The problem arises when this same radio is used for an analog call with a constant envelope signal. Now the transmitter is on for 100% of the conversation time and, since it operates at an average power 3.2 dB below the optimum power out, efficiency is poor. Data on test circuits shows drops in the 12 percentage point range. This translates into a substantial increase in transmit current. The increased current requirements will substantially decrease the time that a battery powered radiotelephone will be useful. There is a resulting need for an amplifier circuit that operates efficiently in both linear and constant envelope modes.

SUMMARY OF THE INVENTION

The present invention encompasses a dual mode power amplifier apparatus that is comprised of at least one amplifying means. The at least one amplifying means has a collector supply input, a signal input, and an output. Each amplifying means generates a signal at the output that has amplified characteristics of an input signal coupled to the signal input.

The dual mode power amplifier apparatus is further comprised of voltage conversion means having a mode select input, a power input, and an output. The voltage conversion means generates a first voltage at the output in response to a first control signal and a second voltage at the output in response to a second control signal. The first and second control signals are coupled to the mode select input of the amplifying means. The voltage conversion means output is coupled to the collector supply input of the amplifying means.

BRIEF DESCRIPTION OF THE DRAWINGS

FIG. 5 shows a block diagram of a typical radiotelephone in accordance with the present invention.

DETAILED DESCRIPTION OF THE PREFERRED EMBODIMENT

The dual mode power amplifier apparatus operates linearly in the linear mode for use in a digital cellular system as well as the constant envelope mode for use in the present analog cellular system. This efficient operation is accomplished without RF switching.

Figure 1:
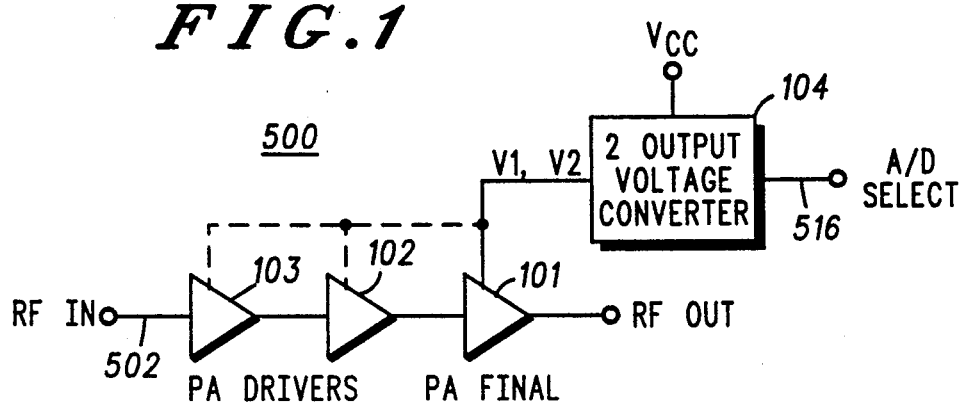
FIG. 1 shows the preferred embodiment of the dual mode power amplifier apparatus of the present invention.

The preferred embodiment of the present invention is illustrated in FIG. 1. The apparatus is comprised of a final power amplifier (101) and two power amplifier drivers (102-103) connected to the RF input signal (502). The power amplifiers (101-103) are connected in series with the final power amplifier (101) outputting the amplified RF signal. The power amplifiers (101-103) used in the preferred embodiment are MHW927A manufactured by Motorola, Inc.

A voltage convertor (104) is connected to the collector supply of each power amplifier stage. The voltage convertor (104) must be an efficient supply that, in the preferred embodiment, is a switching power supply. The voltage convertor (104) is connected to a voltage $V_{cc}$ that is 12.5 V in the preferred embodiment. The voltage convertor (104) is capable of generating two voltages from $V_{cc}$. Which voltage is generated is chosen by the analog/digital mode select line (105) connected to the convertor (104). A logical high on this line (105) selects the analog mode and a logical low selects the digital mode. In the preferred embodiment, a logical high is +5.0 V and a logical low is 0 V. The analog mode is also referred to in the art as the constant envelope mode and the digital mode is referred to as the linear mode.

When the digital mode is selected, the voltage convertor (104) supplies a voltage $V_1$ that is close to $V_{cc}$; 12.5 V in the preferred embodiment. This is the design voltage of the power amplifiers (101-103) and allows the amplifiers (101-103) to provide its designed value of linearity at its rated power out. Providing 12.5 V to the power amplifiers (101-103) is accomplished by turning off the voltage convertor (104) and turning on an internal pass device that allows the full $V_{cc}$ to reach the amplifiers with minimal loss. The pass device is transistor, so $V_{cc}$ minus the voltage drop across the transistor equals the voltage to the power amplifiers.

If the analog mode is selected, the voltage convertor (104) is on and generates a predetermined voltage $V_2$ to the power amplifiers (101-103) that is significantly less than $V_{cc}$. In the preferred embodiment, this voltage is 8.65 V. With this reduced supply voltage, the AC collector voltage magnitude at the reduced power out will again be close to the DC supply voltage as it was at the peak linear power out with the higher supply voltage of $V_{cc}$. Efficiency in the analog mode, therefore, is still optimum.

In an ideal situation, the relationship between the $V_1$ and $V_2$ is the same as the relationship between the peak linear mode power and the constant envelope mode power. For U.S. Digital Cellular, the difference is 3.2 dB, thus making $V_2$ 3.2 dB less than $V_1$. For optimum performance in a real situation, however, the difference between $V_1$ and $V_2$ varies from the ideal due to saturation and other non-ideal effects.

To illustrate the use of the dual mode power amplifier apparatus of the present invention, it is first assumed that the hybrid digital/analog radiotelephone is operating in the U.S. Digital Cellular system. The mode selection signal (105) is brought low to select the digital mode. This turns off the switching power supply (104), thus allowing the 12.5 V $V_{cc}$ to be applied to the collector supply of the power amplifiers (101-103). The higher collector voltage allows the power amplifiers (101-103) to operate linearly at their designed value of linearity at their rated output power.

Figure 3:
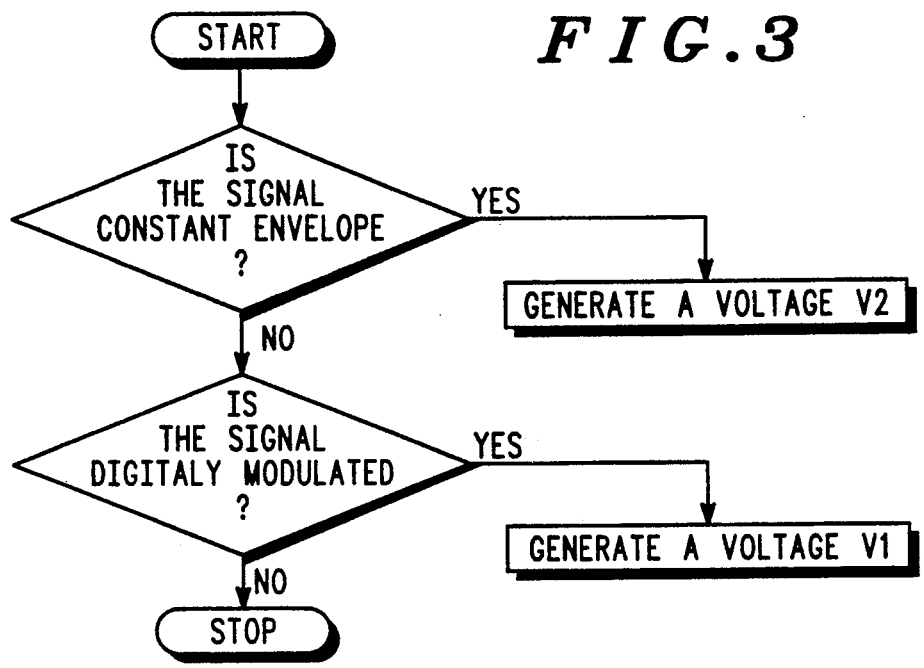
FIG. 3 shows a flowchart of the method of the present invention.

When the radiotelephone is operating in the analog cellular system, the mode selection signal (105) is high to select the analog mode of the amplifier apparatus. The switching power supply (104) is on, generating a voltage of 8.65 V that is applied to the collectors of the power amplifiers (101-103). Since the transmitted signal is a constant envelope signal at a reduced power out, the reduced collector voltage allows the power amplifiers (101-103) to operate efficiently at an AC collector voltage closer to the supply voltage. The above described method of the present invention is illustrated in the flowchart of FIG. 3.

Figure 2:
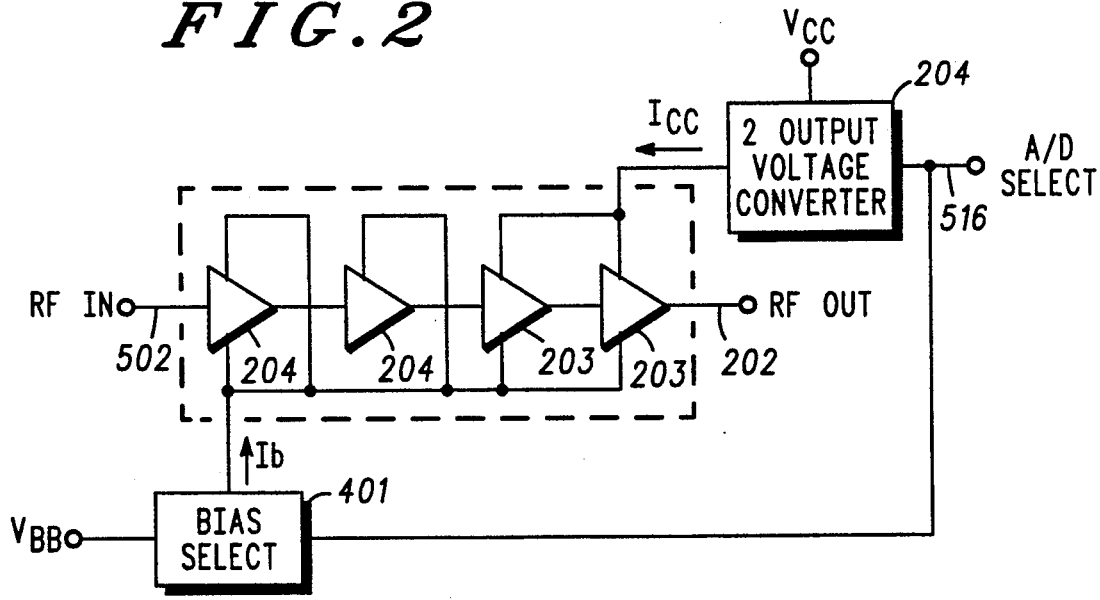
FIG. 2 shows another embodiment of the dual mode power amplifier apparatus of the present invention.
Figure 4:
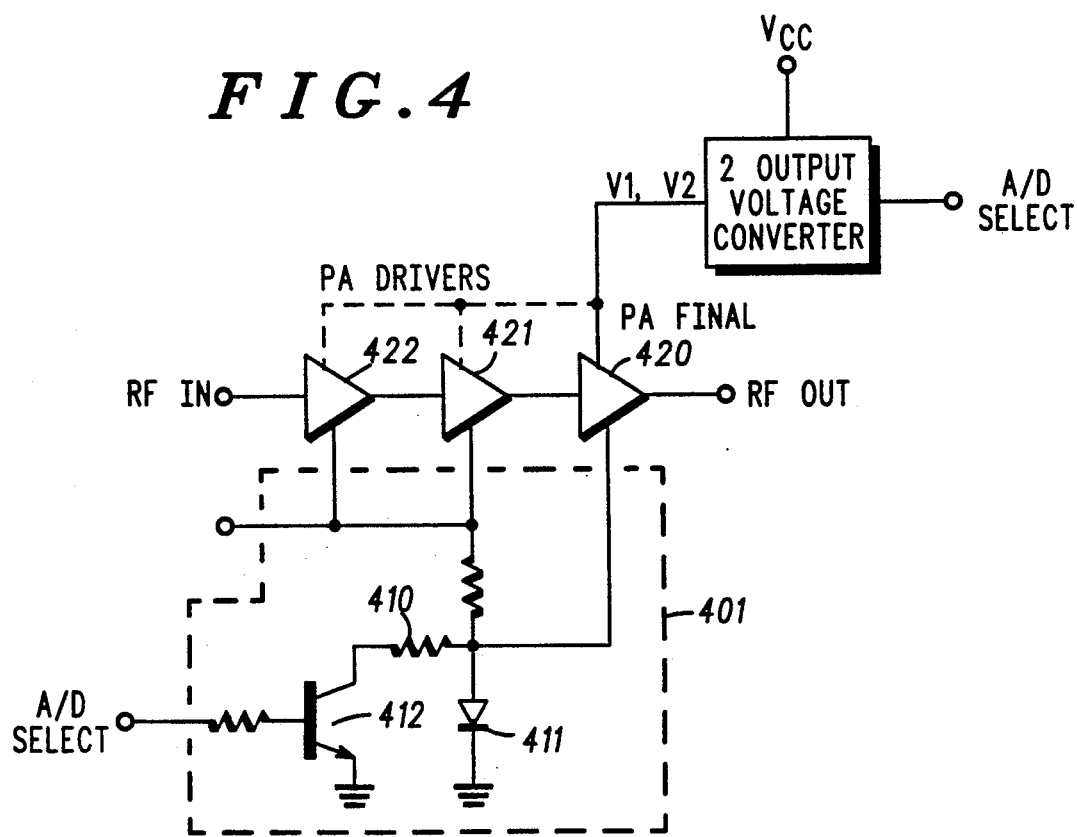
FIG. 4 shows yet another embodiment of the dual mode power amplifier apparatus of the present invention.

Another embodiment of the present invention is illustrated in FIG. 2. This embodiment is comprised of a four stage power amplifier module, such as a Motorola MHW927A module. The bias for the last two stages (203) and both bias and supply for the first two stages (204) are tied together. The collectors of the last two stages are also tied together. These collectors are connected to a voltage convertor (204) that generates two voltages. This voltage convertor (204) the same kind of voltage convertor (104) as discussed in the preferred embodiment. The signal to be amplified is coupled to the RF input (502) and the RF output (202) is the amplified signal. A bias select circuit (401), illustrated in greater detail in FIG. 4, generates the bias voltage $V_{bb}$.

The $V_{bb}$ selection is performed by the analog/digital select line (516). By bringing this line low to select the digital mode, the transistor (412) is off making the only voltage at the bias of the final stage (420) of the power amplifier the 0.70 V drop across the diode (411). The power amplifier is now in the linear mode. When the analog/digital select line (516) is high, the transistor (412) is in saturation and the voltage at the final stage (420) of the power amplifier is the 0.20 V saturation voltage of the transistor (412). A resistor (410) in the collector leg of the transistor (412) is chosen very small, 0.1Ω in the preferred embodiment, for current limiting. The power amplifier drivers (421-422) always have $V_{bb}$ as the bias voltage.

The embodiment of FIG. 2 will be used to illustrate the efficiency provided by the dual mode power amplifier. The bias connection is held at 9.5 V. The collector voltage of the last two stages was varied between the rated supply voltage of 12.5 V and a value 3.2 dB less, 8.65 V. The results of this operation are illustrated in the following table:

|  | Digital Avg. $P_o$ $P_o$ = 37.8 dBm $V_{cc}$ = 12.5 V | Digital Peak $P_o$ $P_o$ = 41.0 dBm $V_{cc}$ = 12.5 V | Analog Avg. $P_o$ $P_o$ = 37.8 dBm $V_{cc}$ = 8.65 V |
| --- | --- | --- | --- |
| $I_{cc}$ (A) | 1.49 A | 2.29 A | 1.59 A |
| $I_b$ (mA) | 193 mA | 192 mA | 193 mA |
| $\eta_{pa}$ (%) | 29.4% | 41.4% | 38.7% |
| System Efficiency (%) | 28.8% | N/A | 33.6% |

The system efficiency was computed assuming 0.2Ω resistance in a FET pass device for the digital mode and an 85% efficient voltage convertor for the analog mode. The efficiency calculation for the power amplifiers is determined by the equation:

$$\eta_{pa} = \frac{P_o}{V_b * I_b + V_{cc} * I_{cc}}$$

where $P_o$ is the power out.

The system efficiency is computed by adding the dissipation of the voltage convertor to the denominator of the $\eta_{pa}$ expression. The above table shows that even with the somewhat higher convertor losses, the concept still improves efficiency by 4% over the digital mode.

FIG. 5 illustrates a block diagram of a typical radio transmitter of the present invention. The actual circuitry embodying the functional blocks of the diagram may be mounted on one or more circuit boards and housed within a conventional radiotelephone housing. The radio transmitter requires only the high efficiency dual mode power amplifier apparatus (104) of the present invention by providing means to operate the amplifier in either a linear mode or a non-linear mode. Efficient amplification of a frequency modulated signal, and amplification of a $\pi/4$ DQPSK modulated signal is thereby possible, while, at the same time, minimizing circuit size and cost.

The microphone (54) converts voice signals into an electrical, information signal (56 and 58). The information signal supplied on line (56) is utilized when, similar to conventional cellular, radiotelephone communications, a frequency modulated information signal is to be generated by the radiotelephone. The information signal supplied on line (58) is utilized when a discrete, encoded signal modulated to form a composite modulated information signal is to be generated by the radiotelephone.

The information signal generated on line (56) is supplied to a voltage controlled oscillator (60) where the information signal is combined with an oscillating signal of a certain frequency. A frequency modulated information signal (62) is generated by the voltage controlled oscillator (60) to a modulator (64). When the radiotelephone is to transmit a frequency modulated information signal, the modulator (64) does not alter the frequency modulated information signal (62), but rather "passes-through" the frequency modulated information signal. The oscillator (60) and modulator (64) may together comprise a hybrid modulation apparatus (68).

The information signal (58) is supplied to a vocoder (72) where the analog information signal is digitized and encoded according to an encoding scheme, and generates a discrete, encoded signal (76) that is supplied to the modulator (64). The modulator (64) modulates the discrete, encoded signal (76) to form a composite, modulated information signal of a pre-determined frequency.

The modulated information signal modulated according to either a frequency modulation technique or a composite modulation technique, is supplied to a mixer (80). The mixer (80) mixes this signal with an offset transmission frequency carrier wave generated by a synthesizer (90) and supplied to the mixer (80). The mixer (80) mixes the modulated information signal with the carrier wave (92). The mixer (80) then generates a modulated information signal (96) upon a carrier wave of a carrier frequency determined by the oscillating frequency of synthesizers (90 and 60).

The modulated information signal (96) is coupled to a filter (540) that forms a passband of frequencies centered about, or close to, the carrier frequency of the transmitted wave. This filter (540) generates a filtered signal (502), containing the modulated information signal, that is coupled to the power amplifier (500) of the present invention. The power amplifier (500) amplifies the modulated information signal to power levels adequate for transmission through an antenna (506). Prior to transmission of the amplified signal, and as illustrated, the amplified signal may be filtered by another filter (507) that may, for example, form a portion of a duplexer. This filter (507) is positioned in-line between the power amplifier (500) and the antenna (506).

A processor (508) provides control signals (510, 512, 514, and 515) to control operation of the oscillator (60), the vocoder (72), the modulator (64), and the synthesizer (90), respectively, to control modulation of the information signal generated by the microphone (54).

The processor (508) controls whether the information signal generated by the microphone (54) is modulated by the oscillator (60) to form a frequency modulated information signal, or alternately, is encoded by the vocoder (72) according to a discrete encoding scheme and modulated by the modulator (64) to form a composite modulated information signal.

As the modulated signals supplied to the amplifier (500), in the preferred embodiment, are frequency modulated or composite modulated information signals, the processor (508) supplies analog/digital select signal (516) to the amplifier (500) to cause operation of the amplifier (504) in either the linear mode or the non-linear mode. The linear mode is enabled when a $\pi/4$ DQPSK modulated signal is to be transmitted and the non-linear mode is enabled when an FM signal is to be transmitted.

FIG. 5 further illustrates the radiotelephone receive circuit for a signal transmitted to the antenna (506). The signal transmitted to the antenna (506) is supplied to the filter (517) which passes signals of desired frequencies to the mixer (518). The mixer (518) receives an oscillating signal (519) from the synthesizer (90) and generates a mixed signal that is supplied to a demodulator (520). The demodulator (520) supplies a demodulated, electrical information signal to a speaker (521). The processor (508) may supply a signal (520A) to the demodulator (120) to control its operation. The speaker (521) converts the electrical information signals into audible signals.

We claim:

1. A dual mode power amplifier apparatus comprising:
   at least one amplifier having a supply input, a signal input, and an output, the amplifier generating a signal at the output that has amplified characteristics of an input signal coupled to the signal input; and
   a switching power supply having a mode select input, a power input, and an output, the switching power supply being off in a first mode, thereby allowing a signal at the power input to pass through to the output, and the switching power supply being on in a second mode, thereby supplying a predetermined voltage to the switching power supply output, the first and second modes being selected in response to a mode select signal coupled to the mode select input, the switching power supply output coupled to the supply input.

2. The dual mode power amplifier apparatus of claim 1 wherein the first mode is a digital mode and the second mode is an analog mode.

3. The dual mode power amplifier apparatus of claim 2 wherein the input signal is a constant envelope signal when the analog mode is selected.

4. The dual mode power amplifier apparatus of claim 2 wherein the input signal is a variable envelope signal when the digital mode is selected.

5. A radiotelephone comprising:
   a modulator that generates a modulated signal for transmission;
   a demodulator for demodulating a received signal;
   a processor for controlling the radiotelephone; and
   a dual mode power amplifier apparatus coupled to the modulated signal, the dual mode power amplifier comprising:

at least one amplifier having a supply input, a signal input, and an output, the amplifier generating a signal at the output that has amplified characteristics of the modulated signal that is coupled to the signal input; and a switching power supply having a mode select input, a power input, and an output, the switching power supply being off in a first mode, thereby allowing a signal at the power input to pass through to the output, and the switching power supply being on in a second mode, thereby supplying a predetermined voltage to the switching power supply output, the first and second modes being selected in response to a mode select signal coupled to the mode select input, the switching power supply output coupled to the supply input.

* * * * *